US009766732B2

United States Patent
Gilman et al.

(10) Patent No.: US 9,766,732 B2
(45) Date of Patent: Sep. 19, 2017

(54) PRINTING OF MULTIPLE INKS TO ACHIEVE PRECISION REGISTRATION DURING SUBSEQUENT PROCESSING

(71) Applicant: 3M INNOVATIVE PROPERTIES COMPANY, St. Paul, MN (US)

(72) Inventors: Ann M. Gilman, Woodbury, MN (US); Daniel J. Theis, Mahtomedi, MN (US); Matthew S. Stay, Minneapolis, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 15/319,020

(22) PCT Filed: Jun. 5, 2015

(86) PCT No.: PCT/US2015/034380
§ 371 (c)(1),
(2) Date: Dec. 15, 2016

(87) PCT Pub. No.: WO2015/195363
PCT Pub. Date: Dec. 23, 2015

(65) Prior Publication Data
US 2017/0115761 A1    Apr. 27, 2017

Related U.S. Application Data

(60) Provisional application No. 62/014,736, filed on Jun. 20, 2014.

(51) Int. Cl.
*B41F 33/00*    (2006.01)
*G06F 3/041*    (2006.01)
(Continued)

(52) U.S. Cl.
CPC ............... *G06F 3/041* (2013.01); *B41M 1/04* (2013.01); *B41M 1/18* (2013.01); *B41M 1/30* (2013.01);
(Continued)

(58) Field of Classification Search
CPC ..... C23C 14/03; C23C 14/042; C23C 14/086; C23C 14/562; C23C 12/5873
See application file for complete search history.

(56) References Cited

U.S. PATENT DOCUMENTS 4,895,631 A    1/1990   Wirz
5,440,446 A    8/1995   Shaw
(Continued)

FOREIGN PATENT DOCUMENTS

WO    WO 2013-096397    6/2013

OTHER PUBLICATIONS

International Search Report for PCT International Application No. PCT/US2015/034380, mailed on Sep. 17, 2015, 4pgs.

*Primary Examiner* — Dah-Wei D Yuan
*Assistant Examiner* — Kristen A Dagenais
(74) *Attorney, Agent, or Firm* — James A. Baker

(57) ABSTRACT

Methods of achieving precision registration in a roll to roll process for making patterned substrates by depositing first and second inks in a predetermined pattern, the predetermined pattern having fiducial marks and main pattern marks. One of these inks prints the fiducial marks onto a substrate while another ink prints main pattern marks on the same substrate such that the predetermined pattern bears a predictable spatial relationship to the pattern of fiducial marks. Consequently, even if the ink forming the predetermined pattern is invisible, or has such low contrast with the substrate that it is effectively invisible, or even has been dissolved away in a subsequent processing step, it is still (Continued)

possible to know where the predetermined pattern is by referring to the pattern of fiducial marks. Touch screen displays including patterned substrates prepared of the methods are also disclosed.

20 Claims, 5 Drawing Sheets

(51) Int. Cl.
*B41M 1/18* (2006.01)
*B41M 1/04* (2006.01)
*B41M 1/30* (2006.01)
*C23C 14/04* (2006.01)
*C23C 14/02* (2006.01)
*C23C 14/08* (2006.01)
*C23C 14/56* (2006.01)
*C23C 14/58* (2006.01)
*H05K 3/04* (2006.01)
*H05K 1/02* (2006.01)

(52) U.S. Cl.
CPC ............ *C23C 14/02* (2013.01); *C23C 14/042* (2013.01); *C23C 14/086* (2013.01); *C23C 14/562* (2013.01); *C23C 14/5873* (2013.01); *H05K 1/0269* (2013.01); *H05K 3/048* (2013.01); *G06F 2203/04103* (2013.01); *H05K 2201/09918* (2013.01); *H05K 2203/0143* (2013.01); *H05K 2203/0568* (2013.01)

(56) References Cited

U.S. PATENT DOCUMENTS

| | | | |
|---|---|---|---|
| 7,018,713 | B2 | 3/2006 | Padiyath |
| 8,002,948 | B2 | 8/2011 | Haubrich |
| 8,847,185 | B2 * | 9/2014 | Theis .................... G05B 19/404 250/548 |
| 9,322,093 | B2 | 4/2016 | Pekurovsky |
| 9,556,510 | B2 * | 1/2017 | Pekurovsky ............ C23C 14/34 |
| 2003/0107640 | A1 | 6/2003 | Chang |
| 2004/0112237 | A1 * | 6/2004 | Chaug .................... B32B 38/10 101/483 |
| 2006/0040095 | A1 * | 2/2006 | Chen ...................... B41J 2/1753 428/209 |
| 2009/0130570 | A1 | 5/2009 | Zhang |
| 2010/0097462 | A1 | 4/2010 | Carlson |
| 2010/0188668 | A1 | 7/2010 | Carlson |
| 2010/0196607 | A1 | 8/2010 | Carlson |
| 2011/0247511 | A1 * | 10/2011 | Carlson .................... B41J 3/543 101/327 |
| 2012/0044317 | A1 | 2/2012 | Tewinkle |
| 2012/0055352 | A1 | 3/2012 | Zitzmann |
| 2012/0068376 | A1 | 3/2012 | Sano |

* cited by examiner

PRINTING OF MULTIPLE INKS TO ACHIEVE PRECISION REGISTRATION DURING SUBSEQUENT PROCESSING

CROSS REFERENCE TO RELATED APPLICATIONS

This application is a national stage filing under 35 U.S.C. 371 of PCT/US2015/034380, filed Jun. 5, 2015, which claims the benefit of U.S. Application No. 62/014,736 filed Jun. 20, 2014, the disclosure of which is incorporated by reference in its/their entirety herein.

BACKGROUND

The fabrication of articles such as flexible electronic or optical components, can involve the application of layers of material deposited or formed on an elongated substrate or web. In particular, patterns of material may be deposited in layers on an elongated substrate, such as a web, through multiple deposition steps. Some articles require precise registration of features that are applied on one or both sides of the substrate.

To achieve accurate registration between the layers, lateral (cross web) positioning and longitudinal (down web) positioning must be maintained as the substrate moves through multiple manufacturing steps. Maintaining registration between layers formed on the substrate becomes more complex when the substrate is flexible or stretchable. Some articles are made in multiple steps during which materials or processes are sequentially applied to the substrate, requiring precise position registration for each of the process steps.

SUMMARY

In one aspect, the disclosure describes a method of achieving precision registration in a roll to roll process by depositing multiple inks onto a substrate in a predetermined pattern comprising both fiducial marks and main pattern marks. One of these inks is used to generate the fiducial marks onto the substrate while another ink prints the main pattern marks on the same substrate such that the predetermined pattern bears a predictable spatial relationship to the pattern of fiducial marks. Consequently, even if the ink forming the main pattern marks is invisible, or has such low contrast with the substrate that it effectively invisible, or even has been dissolved away in a subsequent processing step, it is still possible to know where the main pattern marks are located by referring to the fiducial marks. In some convenient embodiments, the predetermined pattern will define conductive circuit traces after secondary operations. In some other convenient embodiments, the predetermined pattern will define at least one aspect of a tamper-resistant security mark.

Embodiments wherein the predetermined pattern is printed in a soluble ink are of particular interest. For example, it is possible to sputter a layer of conductive material onto the printed substrate and then rinse the substrate so as to remove the soluble ink.

This also removes the sputtered layer above the soluble ink. If the fiducial marks are not soluble in the solvent, the location of the pattern in the sputtered layer can be known, even if that pattern is invisible, or has such low contrast with the substrate that it is effectively invisible.

In one exemplary embodiment, the disclosure describes a method of patterning a substrate, comprising: providing a printing roll, a first ink dispenser, and a printer, wherein the printing roll has a predetermined pattern thereon, the predetermined pattern having both fiducial marks and main pattern marks; dispensing a first ink soluble in a selected solvent onto the printing roll with the first ink dispenser; advancing the substrate against the printing roll, printing the negative of the predetermined pattern onto the substrate with the first ink; advancing the substrate past a printer and applying a second ink that is non-soluble in the selected solvent only onto the negative of the fiducial marks; overlaying a layer of functional material onto the substrate over the predetermined pattern; and rinsing the substrate with the selected solvent removing the soluble ink, leaving the functional material following the pattern of the main pattern marks and the non-soluble ink following the pattern of the fiducial marks on the substrate.

In another exemplary embodiment, the disclosure describes a method of patterning a substrate with a predetermined pattern having both fiducial marks and main pattern marks, comprising: coating at least a first visible ink and a second conductive ink in at least one longitudinal lane each onto the substrate; applying a predetermined pattern with a resist material onto the first and second inks, the predetermined pattern having both fiducial marks within the lane(s) coated with the first visible ink and main pattern marks within the lane(s) coated by the second conductive ink; hardening or curing the resist matrix material; over coating the pattern with a strippable polymer layer; peeling the strippable polymer layer from the substrate, removing the portions of the first and the second inks not protected by the resist.

LISTING OF EXEMPLARY EMBODIMENTS

A. A method of patterning a substrate, comprising:
providing a printing roll, a first ink dispenser, and a printer, wherein the printing roll has a predetermined pattern thereon, the predetermined pattern having both fiducial marks and main pattern marks;
dispensing a first ink soluble in a selected solvent onto the printing roll with the first ink dispenser;
advancing the substrate against the printing roll, printing the negative of the predetermined pattern onto the substrate with the first ink;
advancing the substrate past a printer and applying a second ink that is non-soluble in the selected solvent onto the fiducial marks;
overlaying a layer of functional material onto the substrate over the predetermined pattern; and
rinsing the substrate with the selected solvent, thereby removing the soluble ink, leaving on the substrate the functional material in the predetermined pattern of the main pattern marks, and the non-soluble ink in the predetermined pattern of the fiducial marks on the substrate.

B. The method of embodiment A, wherein the selected solvent is water.

C. The method of embodiments A or B, wherein the second ink is UV curable, and wherein the method further comprises curing the second ink with UV radiation.

D. The method of embodiments A, B, or C, wherein the printing roll is a roll selected from the group consisting of flexographic, gravure, dual offset and screen rolls.

E. The method of embodiments A, B, C, or D, wherein the predetermined pattern includes features having a dimension of less than 20 microns in size.

F. The method of embodiments A, B, C, D, or E, wherein the fiducial marks and the predetermined pattern are in registration with a dimensional accuracy of less than 20 microns.

G. The method of embodiments A, B, C, D, E, or F, wherein the functional material is a conductive material selected from the group consisting of metal, conductive metal oxides, and conductive inks.

H. A touch screen display comprising a patterned substrate prepared by the methods of embodiments A, B, C, D, E, F, or G.

I. The touch screen display of embodiment H, wherein the touch screen display is a component of an electronic device selected from a cellular telephone, a tablet computer, a notebook computer, a laptop computer, a computer display, or a television.

J. A method of patterning a substrate with a predetermined pattern having both fiducial marks and main pattern marks, comprising:

coating at least a first visible ink and a second ink in at least one longitudinal lane each onto the substrate;

applying a predetermined pattern with a resist material onto the first and second inks, the predetermined pattern having both fiducial marks within the lane(s) coated with the first visible ink and main pattern marks within the lane(s) coated by the second ink;

hardening or curing the resist material;

over coating the pattern with a strippable polymer layer; and peeling the strippable polymer layer from the substrate, thereby removing the portions of the first and the second inks not protected by the resist.

K. The method of embodiment J, wherein the second ink comprises nanowires and is conductive.

L. The method of embodiment J, or K, wherein over coating the pattern with the strippable polymer layer comprises over coating the one or more first regions and the one or more second regions with a strippable polymer layer-forming liquid.

M. The method of embodiment L, wherein the strippable polymer layer-forming liquid is selected from the group consisting of polymer solution, monomer, monomer solution, and polymer melt.

N. The method of embodiment M, wherein the strippable polymer layer-forming liquid comprises a polymer solution and over coating includes slot coating, roll coating, flood coating, notch bar coating, direct gravure, offset gravure or spraying.

O. The method of embodiment M, or N, wherein the strippable polymer layer-forming liquid comprises PVA.

P. The method of embodiments J, K, L, M, N, or O, wherein the predetermined pattern is applied by a printing roll selected from the group consisting of flexographic, gravure, dual offset, and screen rolls.

Q. The method of embodiments J, K, L, M, N, O, or P, wherein the predetermined pattern includes features having a dimension less than 20 microns in size.

R. The method of embodiments J, K, L, M, N, O, P, or Q, wherein the fiducial marks and the first predetermined pattern are in registration with a dimensional accuracy of less than 20 microns.

S. A touch screen display comprising a patterned substrate prepared by the methods of embodiments J, K, L, M, N, O, P, Q, or R.

T. The touch screen display of embodiment S, wherein the touch screen display is a component of an electronic device selected from a cellular telephone, a tablet computer, a notebook computer, a laptop computer, a computer display, or a television.

Various aspects and advantages of exemplary embodiments of the disclosure have been summarized. The above Summary is not intended to describe each illustrated embodiment or every implementation of the present certain exemplary embodiments of the present disclosure. The Drawings and the Detailed Description that follow more particularly exemplify certain preferred embodiments using the principles disclosed herein.

BRIEF DESCRIPTION OF THE DRAWINGS

The disclosure may be more completely understood in consideration of the following detailed description of various embodiments of the disclosure in connection with the accompanying drawings, in which.

Figure 1:
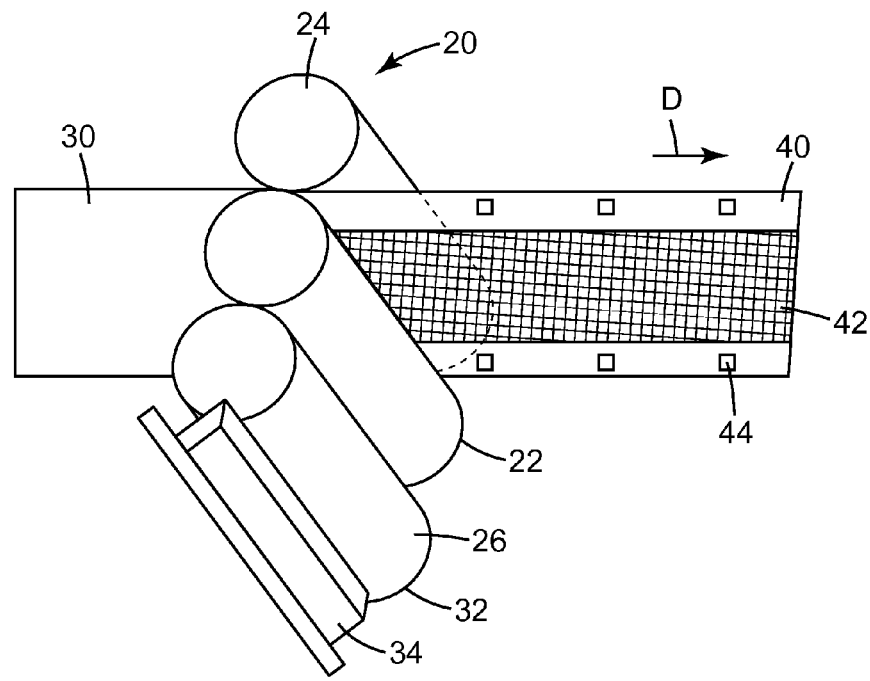
FIG. 1 is a perspective view of a printing apparatus carrying out a portion of a first embodiment of the disclosure.

In the drawings, like reference numerals indicate like elements. While the above-identified drawing, which may not be drawn to scale, sets forth various embodiments of the present disclosure, other embodiments are also contemplated, as noted in the Detailed Description. In all cases, this disclosure describes the presently disclosed disclosure by way of representation of exemplary embodiments and not by express limitations. It should be understood that numerous other modifications and embodiments can be devised by those skilled in the art, which fall within the scope and spirit of this disclosure.

DETAILED DESCRIPTION

Copending PCT application US2013/074231 discloses a method of achieving precision registration in a roll to roll process by simultaneously depositing multiple inks onto a printing roll. One of these inks prints a pattern of fiducial marks onto a substrate while another ink prints a predetermined pattern on the same substrate such that the predetermined pattern bears a predictable spatial relationship to the pattern of fiducial marks. Consequently, even if the ink forming the predetermined pattern is invisible, or has such low contrast with the substrate that it effectively invisible, or even has been dissolved away in a subsequent processing step, it is still possible to know where the predetermined pattern is by referring to the pattern of fiducial marks. However, these methods require a fairly wide minimum separation between the predetermined pattern and the fiducial marks. This results in wasted material, especially when the predetermined pattern and their associated fiducial marks are laid out in a two-up arrangement.

For the following Glossary of defined terms, these definitions shall be applied for the entire application, unless a different definition is provided in the claims or elsewhere in the specification.

Glossary

Certain terms are used throughout the description and the claims that, while for the most part are well known, may require some explanation. It should understood that:

In this application, "contrast" means the degree of dissimilarity of a measured quantity such as luminance of two areas, expressed as a number computed by a specified formula. This definition comes from ASTM Standard E284, "Standard Terminology of Appearance." In the broadest sense a "low contrast ink" is any ink that is insufficiently optically distinguishable from the substrate to allow a secondary operation on the substrate to be directly registered with predetermined pattern. A more formal definition is presented in connection with the optical test discussed in Example 3 below.

In this application, "predetermined pattern" means a pattern that can include lines, repeating lines, traces, symbols, letters, figures, graphics, numbers, or combinations thereof by way of example; that is determined or selected in advance to be placed onto the substrate by suitable replicating methods such as printing. The predetermined pattern can include features having a dimension of less than 20, 10, or 5 microns in size.

In this application "fiducial marks" means a pattern of symbols, lines, points, or other shapes placed onto the substrate for use by an imaging system as a point of reference for obtaining information on web displacement, web speed, or web position.

In this application, the terms "polymer" or "polymers" includes homopolymers and copolymers, as well as homopolymers or copolymers that may be formed in a miscible blend, e.g., by coextrusion or by reaction, including, e.g., transesterification. The term "copolymer" includes random, block and star (e.g. dendritic) copolymers.

In this application, the term "adjoining" with reference to a particular layer means joined with or attached to another layer, in a position wherein the two layers are either next to (i.e., adjacent to) and directly contacting each other, or contiguous with each other but not in direct contact (i.e., there are one or more additional layers intervening between the layers).

In this application, by using terms of orientation such as "atop", "on", "over," "covering", "uppermost", "underlying" and the like for the location of various elements in the disclosed coated articles, we refer to the relative position of an element with respect to a horizontally-disposed, upwardly-facing substrate. However, unless otherwise indicated, it is not intended that the substrate or articles should have any particular orientation in space during or after manufacture.

In this application, by using the term "overcoated" to describe the position of a layer with respect to a substrate or other element of an article of the present disclosure, we refer to the layer as being atop the substrate or other element, but not necessarily contiguous to either the substrate or the other element.

In this application, the terms "about" or "approximately" with reference to a numerical value or a shape means +/− five percent of the numerical value or property or characteristic, but expressly includes the exact numerical value. For example, a viscosity of "about" 1 Pa-sec refers to a viscosity from 0.95 to 1.05 Pa-sec, but also expressly includes a viscosity of exactly 1 Pa-sec. Similarly, a perimeter that is "substantially square" is intended to describe a geometric shape having four lateral edges in which each lateral edge has a length which is from 95% to 105% of the length of any other lateral edge, but which also includes a geometric shape in which each lateral edge has exactly the same length.

In this application, the term "substantially" with reference to a property or characteristic means that the property or characteristic is exhibited to a greater extent than the opposite of that property or characteristic is exhibited. For example, a substrate that is "substantially" transparent refers to a substrate that transmits more radiation (e.g. visible light) than it fails to transmit (e.g. absorbs and reflects). Thus, a substrate that transmits more than 50% of the visible light incident upon its surface is substantially transparent, but a substrate that transmits 50% or less of the visible light incident upon its surface is not substantially transparent.

In this application, the singular forms "a", "an", and "the" include plural referents unless the content clearly dictates otherwise. Thus, for example, reference to fine fibers containing "a compound" includes a mixture of two or more compounds. As used in this specification and the appended embodiments, the term "or" is generally employed in its sense including "and/or" unless the content clearly dictates otherwise.

As used in this application, the recitation of numerical ranges by endpoints includes all numbers subsumed within that range (e.g. 1 to 5 includes 1, 1.5, 2, 2.75, 3, 3.8, 4, and 5).

Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the specification and more particularly the Listing of Exemplary Embodiments and the claims can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

Exemplary embodiments of the present disclosure may take on various modifications and alterations without departing from the spirit and scope of the present disclosure. Accordingly, it is to be understood that the embodiments of the present disclosure are not to be limited to the following described exemplary embodiments, but is to be controlled by the limitations set forth in the claims and any equivalents thereof.

Thus, in one exemplary embodiment, the disclosure provides describes a method of achieving precision registration in a roll to roll process by depositing multiple inks onto a substrate in a predetermined pattern comprising both fiducial marks and main pattern marks. One of these inks is used to generate the fiducial marks onto the substrate while another ink prints the main pattern marks on the same substrate such that the predetermined pattern bears a predictable spatial relationship to the pattern of fiducial marks. Consequently, even if the ink forming the main pattern marks is invisible, or has such low contrast with the substrate that it effectively invisible, or even has been dissolved away in a subsequent processing step, it is still possible to know where the main pattern marks are located by referring to the fiducial marks. In some convenient embodiments, the predetermined pattern will define conductive circuit traces after secondary operations. In some other convenient embodiments, the predetermined pattern will define at least one aspect of a tamper-resistant security mark.

Various exemplary embodiments of the disclosure will now be described with particular reference to the Drawings. Referring now to FIG. 1, a perspective view of a printing apparatus 20 suitable carrying out a portion of a first embodiment of the present disclosure is illustrated. The printing apparatus 20 includes a printing roll 22 and back-up roll 24. A substrate 30, in the illustrated embodiment a web of indefinite length material, is nipped between printing roll 22 and back-up roll 24 and being advanced in direction "D". The printing roll 22 is conveniently inked with a first ink 26 by, e.g. an anilox roll 32 and an ink dispenser 34. Printing roll 22 is conveniently a plate roll or a microflexo roll, but embodiments of the disclosure are workable with, e.g. equipment for flexo printing, gravure printing, screen printing, ink jet printing, and dual offset printing. The first ink is soluble in a selected solvent; in many convenient embodiments, the selected solvent is water. Downstream of the printing apparatus 20, it will be seen that a predetermined pattern 40 has been printed onto the substrate. The predetermined pattern 40 includes main pattern marks 42 and fiducial marks 44.

When the printing roll 22 is a microflexo printing roll, the fabrication methods disclosed in US2012/044317, "Method for Making, Inking, and Mounting Stamps for Micro-contact Printing," may be advantageously used. As mentioned there, a micro-contact printing stamp for, e.g. printing electrical circuit predetermined patterns can result in printed traces is less than 20, 10, or even 5 microns. Further, the fiducial marks and the predetermined pattern can be laid down in registration with a dimensional accuracy of less than 20, 10, or even 5 microns. Mounting a microflexo stamp to the printing roll 22 may be advantageously accomplished using the techniques disclosed in US2012/055352, "Method and Apparatus for Applying a Stamp for Micro-contact Printing to a Stamping Roll."

Figure 2:
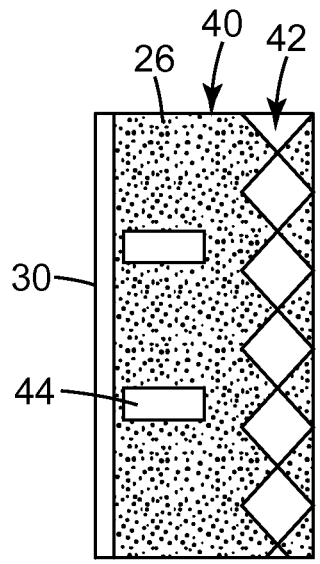
FIG. 2 is a partial top view of one edge of the substrate with the predetermined pattern applied by the printing apparatus of FIG. 1.

Referring now to FIG. 2, a partial top close up view of one edge of the substrate 30 with the predetermined pattern 40 applied by the printing apparatus 20 of FIG. 1 is illustrated. In this view it can be appreciated that the fiducial marks 44 bear a fixed spatial relationship to the main pattern marks. As will be elucidated below, this will allow the main pattern marks to be very accurately located by referencing the fiducial marks, even if in a subsequent processing step the main pattern marks have been rendered in a material that is invisible, or has such low contrast with the substrate that it effectively invisible.

Figure 3:
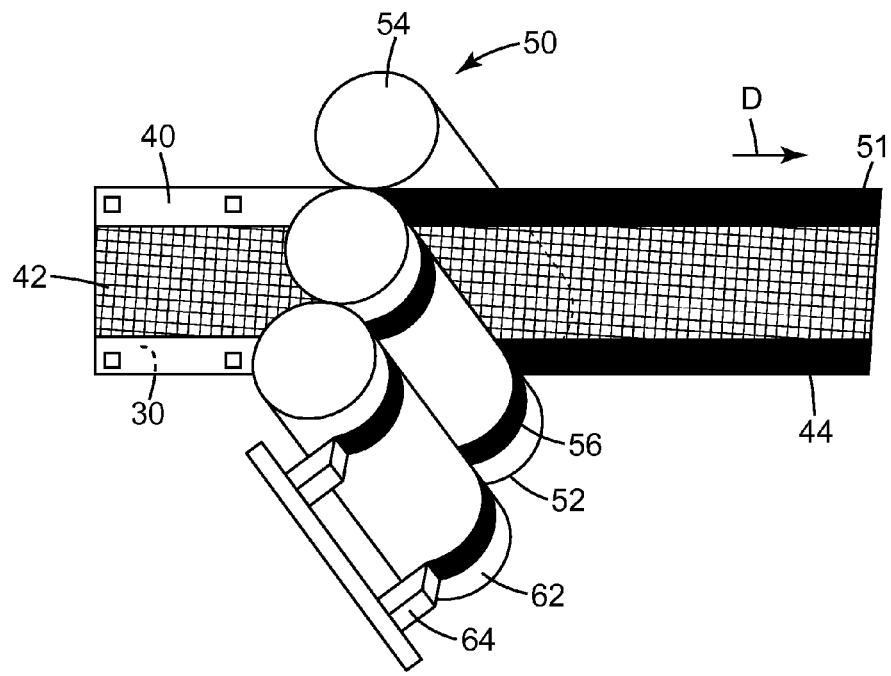
FIG. 3 is a perspective view of the substrate of FIG. 2 being advanced past a printer for the purpose of applying a second ink.

Referring now to FIG. 3, a perspective view of the substrate of FIG. 2 being advanced past a printer 50 for the purpose of applying a second ink 51 is illustrated. The illustrated printer 50 includes a printing roll 52 and back-up roll 54, however other printers such as flexo printers and inkjet printers may be used. The substrate 30, having been printed with the predetermined pattern 40 by the printing apparatus 20 of FIG. 1 is now nipped between printing roll 52 and back-up roll 54 and advanced in direction "D". The printing roll 52 is conveniently inked with a second ink 56 by, e.g. an anilox roll 62 and an ink dispenser 64. Printing roll 52 is conveniently a plate roll or a microflexo roll, but embodiments of the disclosure are workable with, e.g. equipment for flexo printing, gravure printing, screen printing, ink jet printing, and dual offset printing. In some convenient embodiments, printer 50 comprises one or more ink jets, and the second ink 56 is applied in discrete patches only above the fiducial marks 44 (hidden by second ink 56 in this Figure), rather than as a continuous lane as shown in this Figure. The second ink 56 is not soluble in the selected solvent. In some embodiments, the second ink is a UV curable ink. In some other embodiments, the second ink is water based ink, becoming indelible either by evaporation or by heat curing.

Figure 4:
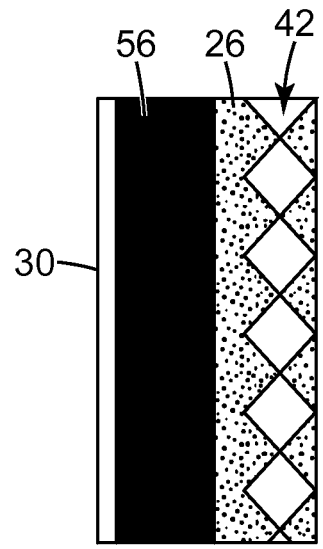
FIG. 4 is a partial top view of one edge of the substrate of FIG. 2 with the second ink applied by the apparatus of FIG. 3 in place.
Figure 5:
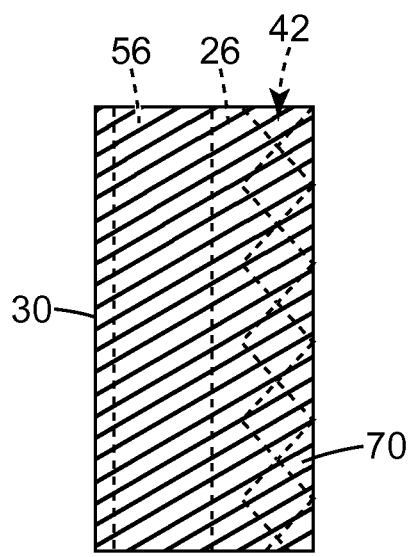
FIG. 5 is a partial top view of the edge of the substrate of FIG. 4 after the application of a layer of functional material.

Referring now to FIG. 4, a partial top detail view of one edge of the substrate of FIG. 2 with the second ink 56 applied by the apparatus of FIG. 3 in place, is illustrated. This twice-inked substrate is now ready for a layer of functional material, overcoating both the second ink 56 and the exposed areas of first ink 26. Exactly what the functional layer is comprised of differs depending on the intended end use of the substrate, but in many convenient embodiments, the functional material is transparent or has low contrast. In many of these and other embodiments, the functional layer is also conductive. One important type of functional layer is both transparent and conductive, namely conductive metal oxides such as indium tin oxide (ITO). A functional layer of ITO is conveniently overcoated onto the substrate by a sputter deposition apparatus of conventional type, e.g. a roll-to-roll vacuum chamber similar to the system described in U.S. Pat. No. 5,440,446 (Shaw et al.) and U.S. Pat. No. 7,018,713 (Padiyath, et al.). Other functional layers are applied by diverse methods appropriate to their nature. FIG. 5 is a partial top view of the edge of the substrate of FIG. 4 after the application of a layer of functional material 70.

Figure 6:
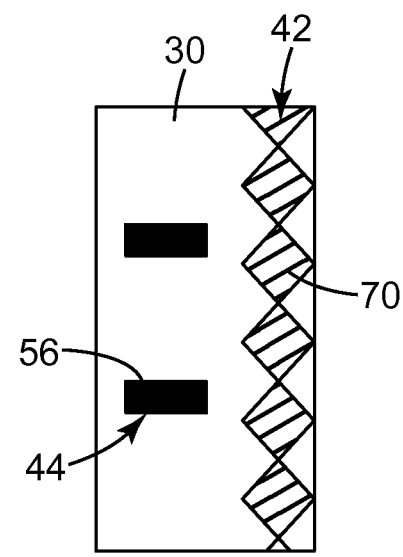
FIG. 6 is a partial top view of the edge of the substrate of FIG. 5 after the rinsing of the substrate in a selected solvent, leaving the main pattern marks in the functional material and the fiducial marks in the second ink.

Once the layer of functional material 70 has been applied to substrate 30, it is then rinsed in the selected solvent, causing the first ink 26 to be dissolved away. This carries away the portion of the functional material 70 that is not on top of either the first ink 26 or the bare substrate 30. Referring now to FIG. 6, a partial top detail view of one edge of the substrate 30 that has received this treatment is illustrated. The fiducial marks 44 are rendered in the second ink 56 while the main pattern marks 42 are rendered in the functional material 70.

Predetermined patterns formed in this way can have features (fiducial marks and/or main pattern marks) with a dimension less than 20 mils (0.5 mm). In various embodiments, the fiducial marks and the main pattern marks are in registration with a dimensional accuracy of less than 20, 10, or even 5 microns. While any pattern of fiducial marks that allows the determination of the position of the predetermined pattern is workable, some possibilities offer distinct advantages. In particular, fiducial marks useful for determining the down web and/or cross web position of a moving web, and methods related to those patterns, can be found in copending and coassigned US application nos. 2010/0196607, "Systems and methods for fabricating displacement scales," 2010/0188668, "Total internal reflection displacement scale;" and 2011/0247511, "Apparatus and Method for Making Fiducials on a Substrate." In particular, the fiducial marks illustrated as 208 in FIG. 4 are disclosed in US 2012/514199, "Phase-locked Web Position Signal Using Web Fiducials."

Figure 7:
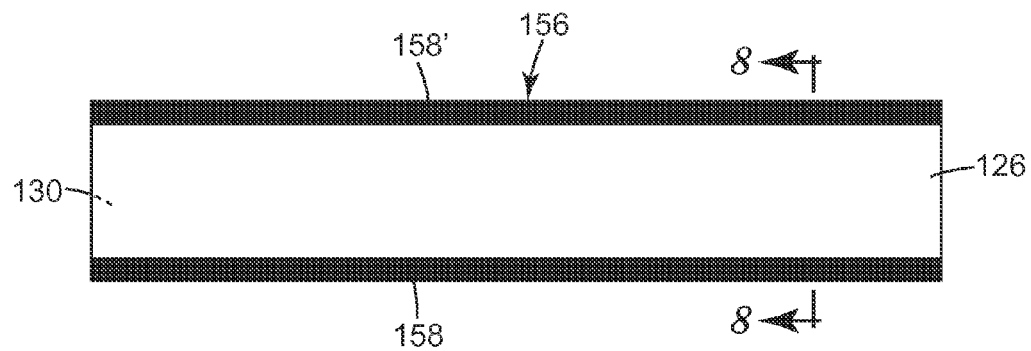
FIG. 7 is a top view of a substrate which has been coated in connection with a second embodiment of the method.
Figure 8:
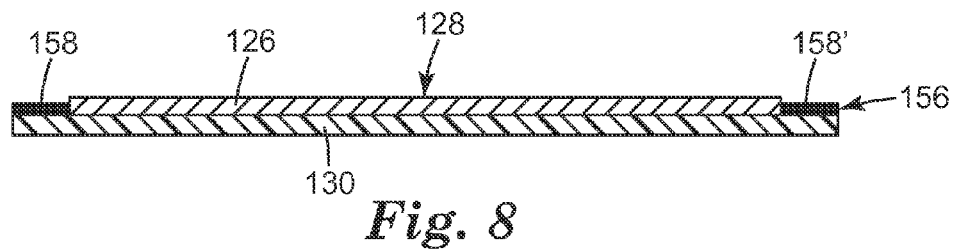
FIG. 8 is a cross-section view of the coated substrate taken along section lines 8-8 in FIG. 7.

Referring now to FIG. 7, a top view of a substrate 130 is illustrated which has been coated in connection with a second embodiment of the method. In this embodiment, substrate 130 has been coated with at least a first visible ink 156 and a second conductive ink 126 in at least one longitudinal lane each onto the substrate 130. In the illustrated embodiment of FIG. 7, the first visible ink 156 has been applied in a first 158 and a second lane 158' while the second, conductive ink 126 has been laid down in a single lane 128. Referring now to FIG. 8, a cross-section view of the coated substrate 130 taken along section lines 8-8 in FIG. 7 is illustrated.

Figure 9:
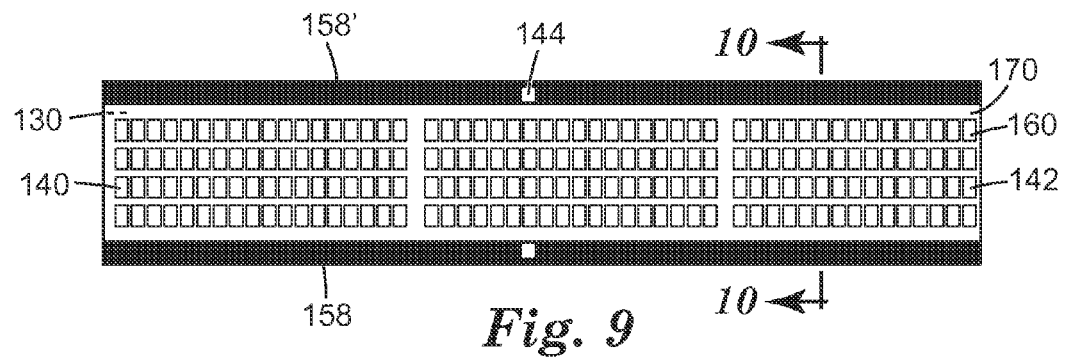
FIG. 9 is a top view of the substrate of FIG. 7 which has been coated with a resist material.
Figure 10:
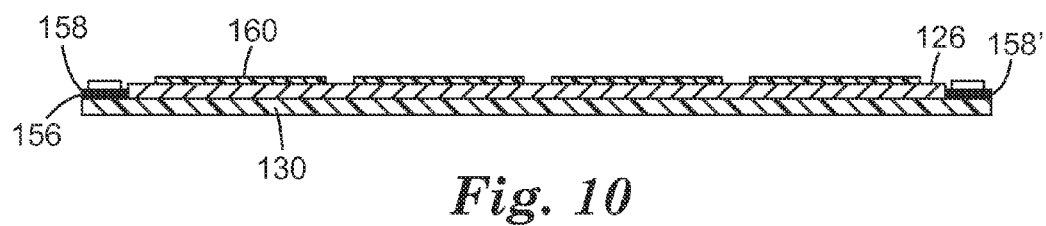
FIG. 10 is a cross-section view of the coated substrate with resist taken along section lines 10-10 in FIG. 9.

Referring now to FIG. 9, a top view of the substrate 130 of FIG. 7 is illustrated, which has had applied to it a resist material 160 onto first visible ink 156 and second conductive ink 126 in a predetermined pattern 140, the predetermined pattern 140 having both fiducial marks 144 within the lane(s) 158 and 158' coated with the first visible ink 156 and main pattern marks 142 within the lane(s) coated by the second, conductive ink 126. Referring now to FIG. 10, a cross-section view of the coated substrate 130 taken along section lines 10-10 in FIG. 9 is illustrated.

Figure 11:
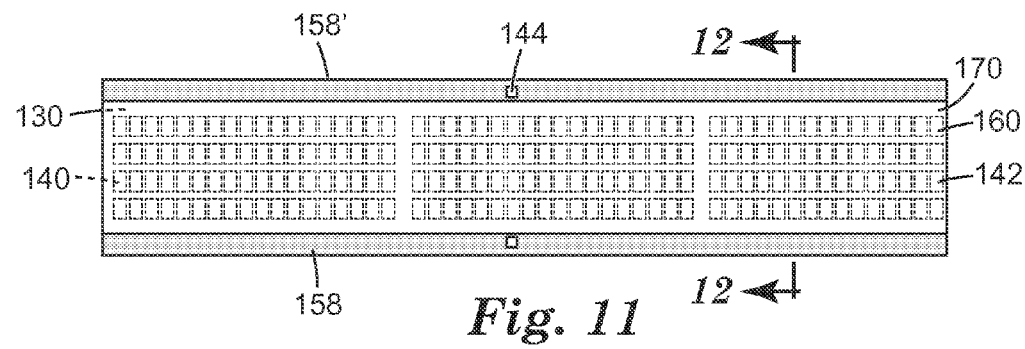
FIG. 11 is a top view of the substrate of FIG. 9 in which the resist material has been hardened or cured and the substrate has been overcoated with a strippable polymer.
Figure 12:
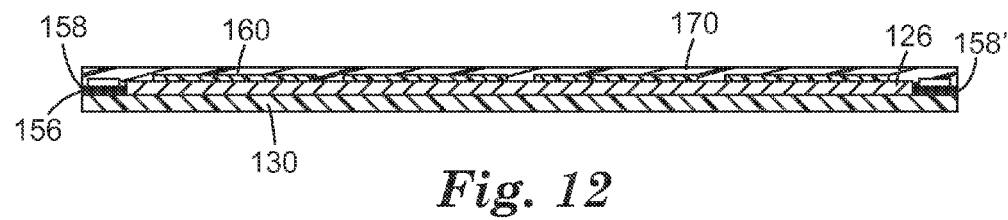
FIG. 12 is a cross-section view of the coated substrate taken along section lines 12-12 in FIG. 11.

Referring now to FIG. 11, a top view of the substrate 130 of FIG. 9 is illustrated, in which resist material 160 has been hardened or cured and the substrate 130 has been over coated with a strippable polymer layer 170. Referring now to FIG. 12, a cross-section view of the coated substrate 130 taken along section lines 12-12 in FIG. 11 is illustrated.

Figure 13:
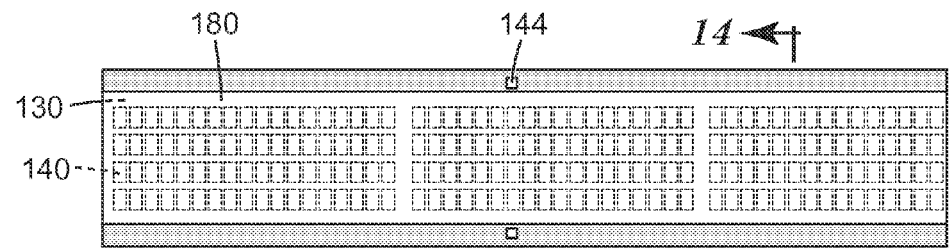
FIG. 13 is a top view of the substrate of FIG. 11 in which a liner has been laminated to the strippable polymer.
Figure 14:
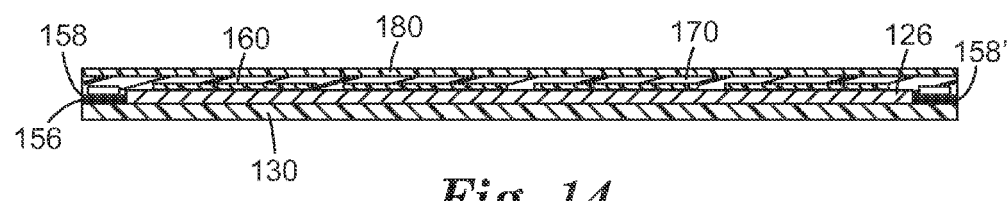
FIG. 14 is a cross-section view of the laminated substrate taken along section lines 14-14 in FIG. 13.

Referring now to FIG. 13, a top view of the substrate 130 of FIG. 11 is illustrated, in which a liner 180 has been laminated to strippable polymer layer 170. This step is considered optional with regard to the second embodiment of the method, needful only if aid is needed to remove the strippable polymer layer 170 as discussed in the next paragraph. Referring now to FIG. 14, a cross-section view of the coated substrate 130 taken along section lines 14-14 in FIG. 13 is illustrated.

Figure 15:
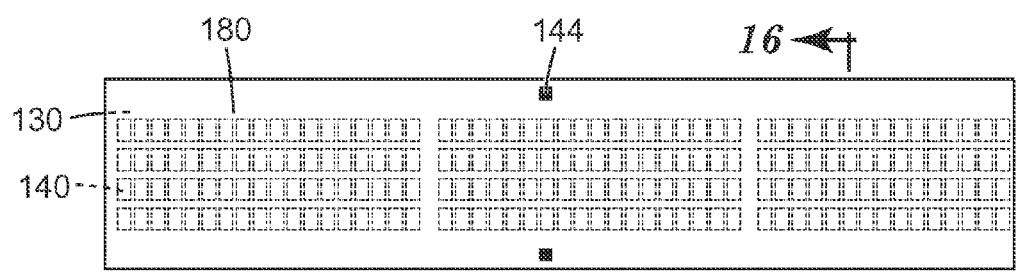
FIG. 15 is a top view of the substrate of FIG. 13 in which a liner and the strippable layer have been peeled away.
Figure 16:
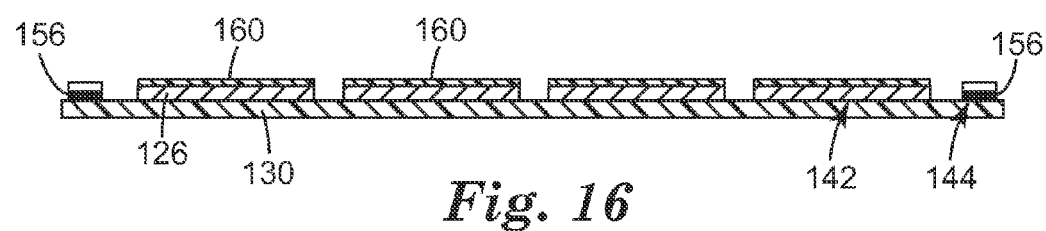
FIG. 16 is a cross-section view of the laminated substrate taken along section lines 16-16 in FIG. 15.

Referring now to FIG. 15, a top view of the substrate 130 of FIG. 13 is illustrated, in which liner 180 and strippable polymer layer 170 have been peeled from the substrate 130, removing the portions of the first 156 and the second 126 inks not protected by the resist material 160. Referring now to FIG. 16, a cross-section view of the coated substrate 130 taken along section lines 16-16 in FIG. 14 is illustrated. Areas not protected by the resist material 160 have been pulled away from the substrate 130, leaving the fiducial marks 144 rendered in first ink 156 and the main pattern marks 142 in second ink 126.

The operation of the present disclosure will be further described with regard to the following detailed examples. These examples are offered to further illustrate the various specific and preferred embodiments and techniques. It should be understood, however, that many variations and modifications may be made while remaining within the scope of the present disclosure.

EXAMPLES

These Examples are merely for illustrative purposes and are not meant to be overly limiting on the scope of the appended claims. Notwithstanding that the numerical ranges and parameters setting forth the broad scope of the present disclosure are approximations, the numerical values set forth in the specific examples are reported as precisely as possible. Any numerical value, however, inherently contains certain errors necessarily resulting from the standard deviation found in their respective testing measurements. At the very least, and not as an attempt to limit the application of the doctrine of equivalents to the scope of the claims, each numerical parameter should at least be construed in light of the number of reported significant digits and by applying ordinary rounding techniques.

Summary of Materials

Unless otherwise noted, all parts, percentages, ratios, etc. in the Examples and the rest of the specification are by weight. Solvents and other reagents used may be obtained from Sigma-Aldrich Chemical Company (Milwaukee, Wis.), unless otherwise noted.

Example 1

A printing apparatus generally as illustrated in FIG. 1 was constructed. The printing roll was 12 cm in diameter. The printing roll had a predetermined pattern comprising main pattern marks of connected diamonds and fiducial marks disposed near the edges of the printing roll. A water soluble ink as disclosed in U.S. Pat. No. 4,895,631 was dispensed by the ink dispenser onto the anilox roll and thereby onto the printing roll. After a pause to allow the roll to become inked, printing was begun onto a substrate of conventional polyester terephthalate (PET) film, conveyed at a line speed of 1.52 m/min and at a tension of 1.5 pli (2.625 N/cm). The printed substrate was then advanced past a printer and a non-water-soluble visible ink was applied by the printer onto the fiducial marks and not onto the main pattern marks. Specifically, the printer was inkjet system commercially available as UNIVERSAL EVOLUTION 1 from Digital Design Inc. of Cedar Grove, N.J. This printer was provided with a 4700BK ink cartridge dispensing a black non-porous ink, also available from Digital Design Inc.

Example 2

The film of Example 1 was passed through a sputter deposition apparatus of conventional type, e.g. a roll-to-roll vacuum chamber similar to the system described in U.S. Pat. No. 5,440,446 (Shaw et al.) and U.S. Pat. No. 7,018,713 (Padiyath, et al.). A 40 nm thick layer of indium tin oxide (ITO) was deposited on the substrate over both the first and the second inks. The substrate was then rinsed in water, causing the water soluble ink to be dissolved away carrying with it the portion of the sputtered layer above the water soluble ink. The fiducial marks printed in the black non-soluble ink remained on the substrate, providing guidance for locating the main pattern marks, now rendered in the nearly invisible ITO.

Example 3

The printed web of Example 2 was conveyed against a conventional printing roll having a secondary pattern intended to be complimentary for a particular end use to the predetermined pattern. Although virtually invisible, the position of the main pattern marks was discernible through their positional relationship with the visible fiducial marks. A secondary pattern is then applied to the web through, e.g. printing or laminating. The web is the conveniently steered into an appropriate registration between the first predetermined pattern and the secondary pattern using, e.g. the techniques of US 2012/068376, "Apparatus for Guiding a Moving Web."

Example 4

A 5 mil (0.13 mm) thick substrate of polyethylene terephthalate (PET) commercially available as MELINEX ST-504 film from Dupont, Wilmington, Del. is coated in two longitudinal lanes. One lane is coated in a first ink comprising 78.75% by weight MacDermid PRINT AND PEEL (available from MacDermid, Inc. of Denver, Colo.), 20.0% by weight of deionized water, and 1.0% by weight of carbon lampblack (available from Fischer Scientific of Pittsburgh, Pa.), and 0.25% Tergitol 15-S-7 (available from Sigma Aldrich of St. Louis, Mo.). This first ink is deposited with a #5 Meyer Rod (available from RDS of Webster, N.Y.), and dried at 100° C. in an oven for 2 minutes, until dry to the touch.

The second longitudinal lane is coated 6 inches (15.2 cm) wide in a second ink comprised of 95% by weight CLEAROHM Ink-N G4-02 (commercially available from Cambrios Technologies Corporation of Sunnyvale, Calif.) and 5% by weight isopropyl alcohol (available from Sigma Aldrich) that is mixed by agitation in a 1 liter clear bottle. The second ink is coated 6 inches (15.25 cm) wide onto the substrate using a slot die, targeting a pre-metered wet film thickness of approximately 15.0 µm at a web speed of 10 ft/min (3.05 m/min) to form a silver nanowire layer on the substrate. The nanowire layer is then heated to a temperature of 105° C. in an air impingement oven for approximately 2 minutes, which results in a coated and dried transparent and electrically conductive nanowire layer.

A pattern composed of an array of 3 mm squares is then flexographically printed in a resist material over both the longitudinal lanes using a flexographic stamp fabricated by Southern Graphics Systems (SGS, Minneapolis, Minn.). The resist material is a transparent UV-curable resin available as UZS00061-408 ink (Flint Group Media, North America, of Batavia, Ill.). The pattern was printed with a 4 bcm/sq. in anilox roll, and is irradiated with high intensity UV light in a nitrogen-purged atmosphere with a 236 Watt/cm$^2$ Fusion H bulb (available from Fusion UV Systems, Inc. of Gaithersburg, Md.).

A strippable polymer layer is then applied over the resist material. This strippable polymer layer is created by coating a mixture composed of 79.75% by weight MacDermid Print and Peel (MacDermid, Inc., Denver, Colo.), 20% deionized water, and 0.25% Tergitol 15-S-7 (Sigma Aldrich, St. Louis, Mo.) onto the resist material over-coating over both the first and second longitudinal lanes. The over-coating is then dried for 2 minutes at 100° C. in a oven, forming the strippable polymer layer. The strippable polymer layer is then peeled from the substrate, removing the nanowires and black ink from the substrate in all regions not covered by the resist material. The resultant pattern on the substrate after peeling includes the array of 3 mm squares of the second ink within the second longitudinal lane and the 3 mm squares of the first ink within the first longitudinal lane. The black squares could now be used as fiducial marks to register a second print to the transparent silver nanowire pattern Example 5

The printed web of Example 4 is conveyed against a conventional printing roll having a secondary pattern intended to be complimentary for a particular end use to the predetermined pattern. Although virtually invisible, the position of the main pattern marks formed in the second, silver nanowire ink is discernible by their positional relationship to the visible fiducial marks under the resist material. A secondary pattern is then applied to the web through, e.g. printing or laminating. The web is the conveniently steered into an appropriate registration between the first predetermined pattern and the secondary pattern using, e.g. the techniques of US 2012/068376, "Apparatus for Guiding a Moving Web."

Reference throughout this specification to "one embodiment," "certain embodiments," "one or more embodiments" or "an embodiment," whether or not including the term "exemplary" preceding the term "embodiment," means that a particular feature, structure, material, or characteristic described in connection with the embodiment is included in at least one embodiment of the certain exemplary embodiments of the present disclosure. Thus, the appearances of the phrases such as "in one or more embodiments," "in certain embodiments," "in one embodiment" or "in an embodiment" in various places throughout this specification are not necessarily referring to the same embodiment of the certain exemplary embodiments of the present disclosure. Furthermore, the particular features, structures, materials, or characteristics may be combined in any suitable manner in one or more embodiments.

While the specification has described in detail certain exemplary embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove. In particular, as used herein, the recitation of numerical ranges by endpoints is intended to include all numbers subsumed within that range (e.g., 1 to 5 includes 1, 1.5, 2, 2.75, 3, 3.80, 4, and 5). In addition, all numbers used herein are assumed to be modified by the term "about."

Furthermore, all publications and patents referenced herein are incorporated by reference in their entirety to the same extent as if each individual publication or patent was specifically and individually indicated to be incorporated by reference. Various exemplary embodiments have been described. These and other embodiments are within the scope of the following claims.

What is claimed is:

1. A method of patterning a substrate, comprising:
   providing a printing roll, a first ink dispenser, and a printer, wherein the printing roll has a predetermined pattern thereon, the predetermined pattern having both fiducial marks and main pattern marks;
   dispensing a first ink soluble in a selected solvent onto the printing roll with the first ink dispenser;
   advancing the substrate against the printing roll, printing the negative of the predetermined pattern onto the substrate with the first ink;
   advancing the substrate past a printer and applying a second ink that is non-soluble in the selected solvent onto the fiducial marks;

overlaying a layer of functional material onto the substrate over the predetermined pattern; and rinsing the substrate with the selected solvent, thereby removing the soluble ink, leaving on the substrate the functional material in the predetermined pattern of the main pattern marks, and the non-soluble ink in the predetermined pattern of the fiducial marks on the substrate.

2. The method of claim 1 wherein the selected solvent is water.

3. The method of claim 1 wherein the second ink is UV curable, and wherein the method further comprises curing the second ink with UV radiation.

4. The method of claim 1 wherein the printing roll is a roll selected from the group consisting of flexographic, gravure, dual offset and screen rolls.

5. The method of claim 1 wherein the predetermined pattern includes features having a dimension of less than 20 microns in size.

6. The method of claim 1 wherein the fiducial marks and the predetermined pattern are in registration with a dimensional accuracy of less than 20 microns.

7. The method of claim 1 wherein the functional material is a conductive material selected from the group consisting of metal, conductive metal oxides, and conductive inks.

8. A touch screen display comprising a patterned substrate prepared of claim 1.

9. The touch screen display of claim 8, wherein the touch screen display is a component of an electronic device selected from a cellular telephone, a tablet computer, a notebook computer, a laptop computer, a computer display, or a television.

10. A method of patterning a substrate with a predetermined pattern having both fiducial marks and main pattern marks, comprising:

coating at least a first visible ink and a second ink in at least one longitudinal lane each onto the substrate;

applying a predetermined pattern with a resist material onto the first and second inks, the predetermined pattern having both fiducial marks within the lane(s) coated with the first visible ink and main pattern marks within the lane(s) coated by the second ink;

hardening or curing the resist material;

over coating the pattern with a strippable polymer layer; and peeling the strippable polymer layer from the substrate, thereby removing the portions of the first and the second inks not protected by the resist.

11. The method of claim 10 wherein the second ink comprises nanowires and is conductive.

12. The method of claim 10 wherein over coating the pattern with the strippable polymer layer comprises over coating the one or more first regions and the one or more second regions with a strippable polymer layer-forming liquid.

13. The method of claim 12 wherein the strippable polymer layer-forming liquid is selected from the group consisting of polymer solution, monomer, monomer solution, and polymer melt.

14. The method of claim 13, wherein the strippable polymer layer-forming liquid comprises a polymer solution and over coating includes slot coating, roll coating, flood coating, notch bar coating, direct gravure, offset gravure or spraying.

15. The method of claim 14 wherein the strippable polymer layer-forming liquid comprises PVA.

16. The method of claim 10 wherein the predetermined pattern is applied by a printing roll selected from the group consisting of flexographic, gravure, dual offset, and screen rolls.

17. The method of claim 10 wherein the predetermined pattern includes features having a dimension less than 20 microns in size.

18. The method of claim 10 wherein the fiducial marks and the first predetermined pattern are in registration with a dimensional accuracy of less than 20 microns.

19. A touch screen display comprising a patterned substrate prepared of claim 10.

20. The touch screen display of claim 19, wherein the touch screen display is a component of an electronic device selected from a cellular telephone, a tablet computer, a notebook computer, a laptop computer, a computer display, or a television.

* * * * *